United States Patent [19]

Sugiyama et al.

[11] Patent Number: 4,781,621
[45] Date of Patent: Nov. 1, 1988

[54] SEALING MATERIAL RECEIVING STRUCTURE IN A JUNCTION BLOCK

[75] Inventors: Masaaki Sugiyama; Hideharu Hayashi, both of Washizu Kosai, Japan

[73] Assignee: Yazaki Corporation, Tokyo, Japan

[21] Appl. No.: 28,659

[22] Filed: Mar. 20, 1987

[30] Foreign Application Priority Data

Mar. 24, 1986 [JP] Japan ............................ 61-041925[U]

[51] Int. Cl.⁴ ............................................... H05K 5/06
[52] U.S. Cl. .................................... 439/559; 174/52 S
[58] Field of Search ............... 439/559, 552, 556, 587, 439/588, 589; 174/52 S, 152 R, 153 R

[56] References Cited

U.S. PATENT DOCUMENTS

| | | | |
|---|---|---|---|
| 2,451,516 | 10/1948 | Skobel | 174/52 S |
| 2,976,512 | 3/1961 | Vallee | 439/556 |
| 3,086,074 | 4/1963 | Just et al. | 439/559 |
| 3,368,117 | 2/1968 | Pond et al. | 361/407 |
| 3,770,878 | 11/1973 | Dozier | 174/153 R |
| 4,259,546 | 3/1981 | Conway | 174/153 R |
| 4,356,344 | 10/1982 | Carey | 174/52 S |

Primary Examiner—Neil Abrams
Attorney, Agent, or Firm—Armstrong, Nikaido, Marmelstein & Kubovcik

[57] ABSTRACT

A sealing material receiving structure in a junction block for use on a vehicle or the like is provided. The junction block comprises a top cover provided with a connector or connectors, or a wiring board; a bottom cover provided with a connector or connectors, or a wiring board; an insulating plate or plates provided with bus bars having tab terminals, and placed between the top and bottom covers; and an elastic plate-shaped packing placed between the lowermost insulating plate and the bottom cover. Rectangular enclosures are formed integrally with the packing so as to surround holes for receiving the tab terminals formed in the packing. Holes for receiving the enclosures therein, respectively, are formed in the bottom cover. The dimensions of the enclosures, the tab terminals, the holes formed in the packing, and the holes formed in the bottom cover are determined selectively so that the tab terminals fit the holes formed in the packing and the enclosures tight, and the enclosures fit the holes formed in the bottom cover tight.

2 Claims, 3 Drawing Sheets

FIG. 6
Prior art
FIG. 1
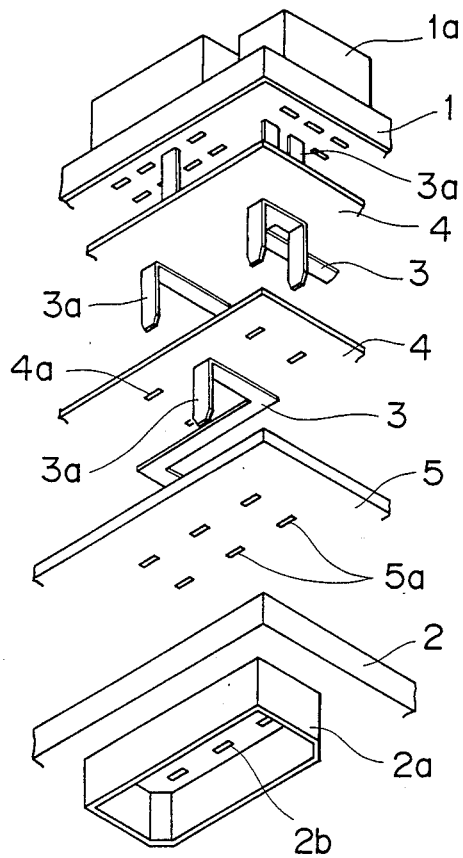
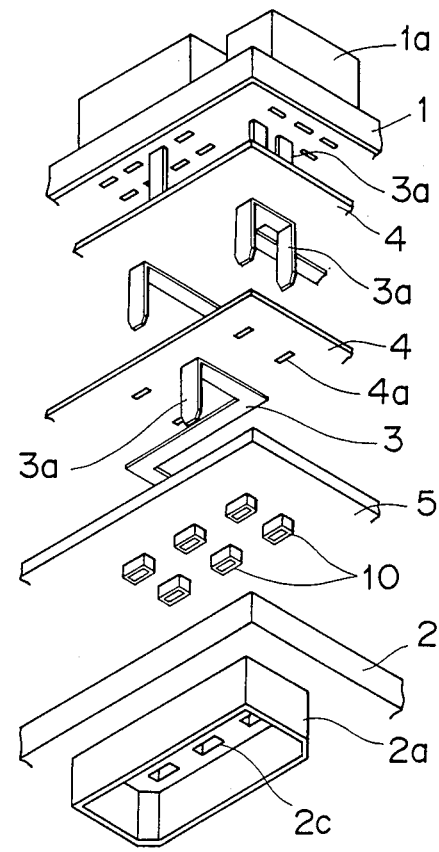

SEALING MATERIAL RECEIVING STRUCTURE IN A JUNCTION BLOCK

BACKGROUND OF THE INVENTION

1. Field of the Invention

The present invention relates to sealing material receiving structure for preventing the leakage of the sealing material impregnated in a junction block for use on a vehicle or the like.

2. Description of the Prior Art

The junction block, in general, comprises, as illustrated in FIG. 6 in an exploded perspective view, a top cover 1 provided with connectors 1a (or wiring boards), a bottom cover 2 provided with a connector 2a (or a wiring board), one or a plurality of insulating plates 4 (in this junction block, two insulating plates) placed one over the other between the top cover 1 and the bottom cover 2 and each provided with bus bars 3 each having tab terminals 3a formed by bending parts of the bus bar 3, and a plate-shaped packing 5 for holding a sealing material formed of an elastic rubber or the like and placed between the lower insulating plate 4 and the bottom cover 2. When necessary, another packing 5 is placed between the upper insulating plate 4 and the top cover 1.

In assembling these components, the lower tab terminals 3a of the upper insulating plate 4 are passed through holes 4a formed through the lower insulating plate 4, the upper tab terminals 3a of the upper insulating plate 4 are connected to the connectors 1a mounted on the top cover 1, and the lower tab terminals 3a of both the upper and lower insulating plates 4 projecting downward from the lower insulating plate 4 are passed through holes 5a formed through the packing 5 and are connected to the connector 2a mounted on the bottom cover 2. The respective connectors 1a and 2a of the top cover 1 and the bottom cover 2 are coupled with connectors 6 of a wire harness (FIG. 7) and connectors of controllers, not shown, including relays and fuses, respectively, to complete the related circuits.

Referring to FIG. 7 showing an exemplary assembly of such a junction block in a sectional view, generally, an insulating sealing material, such as resins and grease, is put between the upper and lower insulating plate 4 or between and around the tab terminals 3a to enhance the reliability of the junction block by preventing short circuits between the bus bars 3 and idle movement of the tab terminals 3a relative to the holes 4a of the lower insulating plate 4. The packing 5 is inserted between the lower insulating plate 4 and the bottom cover 2 to prevent the leakage of the sealing material due to the filling pressure applied to the sealing material or the gravity flow of the sealing material through gaps between the holes 2b of the bottom cover 2 and the tab terminals 3a passed through the holes 2b. When the tab terminals 3a have been passed through the holes 5a of the packing 5, flat surfaces 3c of the tab terminals 3a are in satisfactorily close sealing contact with walls of the holes 5a, respectively, but sealing portions 7 of the packing 5 near sharp edges 3b of the tab terminals 3a are warped as shown in FIGS. 8 and 9, and hence the edges 3b of the tab terminals 3a and the packing 5 are in incomplete sealing contact. Therefore, as shown in FIG. 9, it has been an ordinary practice to prevent the leakage of the sealing material from the junction block by applying a sealant 9 to the sealing portions 7 with a syringe 8 or the like. However, such a sealing process requires additional work and material for applying the sealant 9 to the sealing portions 7 and increases the cost of the junction block. Furthermore, since the distance $\gamma$ between the lower surface of the lower insulating plate 4 and the extremity of the sealant 9 varies at each sealing portion 7, the insulating plates 4 and bottom cover plate are liable to be warped when the junction block is assembled, which causes variations in the length of the tab terminals 3a projecting into the connector 2a and causes the tab terminals 3a to tilt and fail to fit correctly in the connectors.

The present invention has been made to eliminate the foregoing drawbacks of the conventional junction block.

SUMMARY OF THE INVENTION

Accordingly, it is an object of the present invention to provide a sealing material receiving structure for a junction block, capable of preventing the sealing material from leaking through gaps between the brims of the holes 5a of the packing 5 and the tab terminals 3a and eliminating difficulties in connecting the tab terminals to connectors.

The sealing material receiving structure, in a preferred embodiment, according to the present invention will now be described with reference to the accompanying drawings, in which like reference characters designate like or corresponding parts throughout FIGS. 1 to 9.

BRIEF DESCRIPTION OF THE DRAWINGS

FIG. 1 is a partly cutaway exploded perspective view of a junction block incorporating a sealing material receiving structure, in a preferred embodiment, according to the present invention;

FIG. 3b is a sectional view taken on line A—A in FIG. 3a;

FIG. 6 is a partly cutaway exploded perspective view of a conventional junction block;

DESCRIPTION OF THE PREFERRED EMBODIMENT

Figure 2:
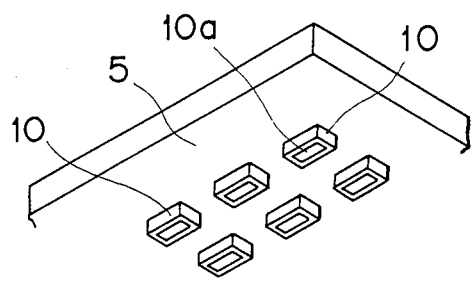
FIG. 2 is a fragmentary perspective view showing the essential portion of a packing employed in the sealing material receiving structure of FIG. 1.

Referring to FIG. 1, a junction block embodying the present invention comprises a top cover 1 provided with connectors 1a, a bottom cover 2 provided with connectors 2a, two insulating plates 4 placed one over the other between the top cover 1 and the bottom cover 2 and each provided with bus bars 3 having tab terminals 3a, and an elastic packing 5 having the shape of a plate and disposed between the lower insulating plate 4 and the bottom cover 2. This junction block is the same as the foregoing conventional junction block in constitution. However, this junction block embodying the present invention is featured by the conformation and dimensions of the holes of the packing 5 for receiving the tab terminals 3a.

Figure 3A:
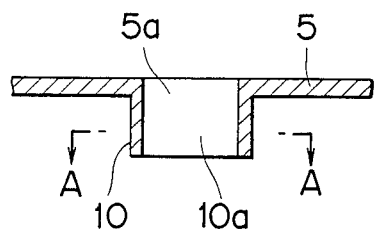
FIG. 3a is a fragmentary sectional view of the packing of FIG. 2.

The packing 5 is provided integrally on the lower surface thereof with rectangular elastic projections or enclosures 10 having holes 10a for receiving the tab terminals 3a and formed around holes 5a formed through the packing 5, respectively, which is best illustrated in FIGS. 2 and 3a.

Figure 3B:
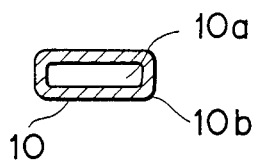
Figure 7:
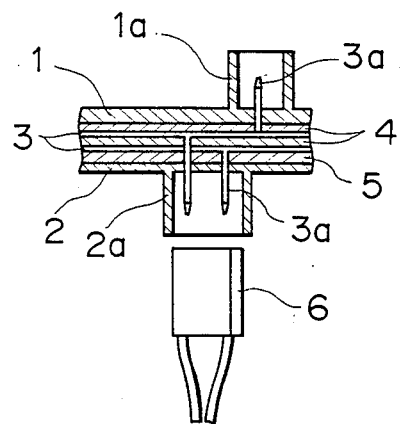
FIG. 7 is a sectional view of the junction block of FIG. 6.
Figure 8:
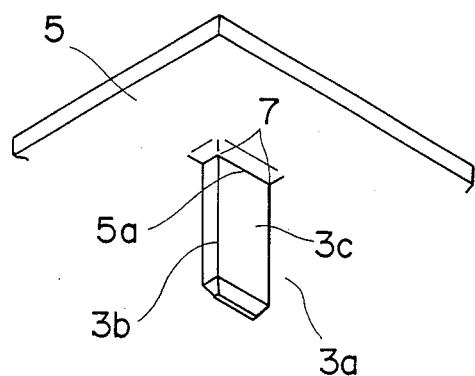
FIG. 8 is a fragmentary perspective view showing the sealing condition made by the conventional sealing material receiving structure.
Figure 9:
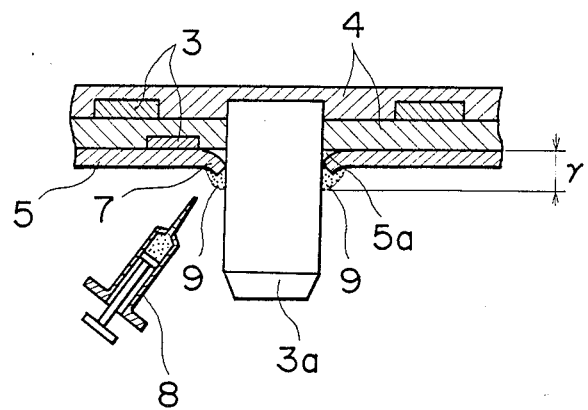
FIG. 9 is a fragmentary sectional view of the conventional junction block of FIG. 6, showing a conventional sealing means.

Referring to FIGS. 2, 3a and 3b, preferably, the four edges 10b of the enclosure 10 are rounded and the four edges 3b of the tab terminal 3a to be passed through the hole 10a of the enclosure 10 are rounded similarly in forming the tab terminals 3a through punching and pressing. The shape of holes 2c formed through the bottom cover 2 to receive the enclosures 10 therethrough, respectively, coincides with the external shape of the enclosures 10.

Figure 4:
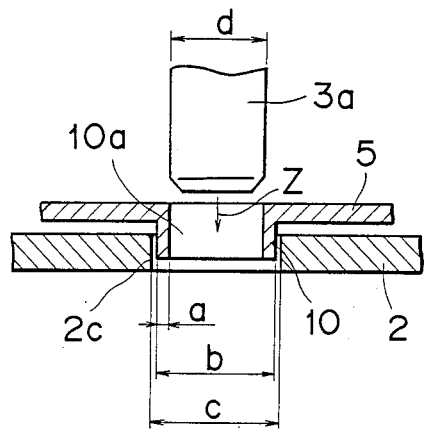
FIG. 4 is a fragmentary sectional view showing the dimensions of the components of the sealing material receiving structure of FIG. 1.

Referring now to FIG. 4, the tab terminals 3a, the enclosures 10 and the holes 2c of the bottom cover 2 are formed so as to satisfy inequalities: $c - 2a < d$, and $c > b$, b, where $a$ = the wall thickness of the enclosures 10, $b$ = the outer major or transverse axial length of the enclosures 10, $c$ = the major axial length of the holes 2c, and $d$ = the major axial width of the tab terminals 3a. The wall thickness $a$ of the enclosure 10, and the clearance $(c - b)/2$ between the outer surface of the enclosure 10 and the inner surface of the hole 2c are uniform over the entire circumference of the enclosure 10.

Referring again to FIG. 4, in assembling the sealing material receiving structure of the junction block, first, the enclosures 10 of the packing 5 are inserted in the hole 2c of the bottom cover 2, respectively, to mount the packing 5 on the bottom cover 2. Since the length c of the holes 2c is greater than the outer length b of the enclosures 10, the enclosures 10 fit smoothly in the holes 2c, respectively, and hence the packing 5 and the bottom cover 2 can be easily assembled.

Figure 5:
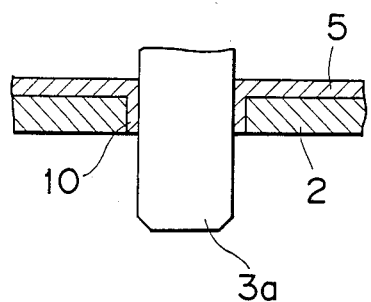
FIG. 5 is a fragmentary sectional view showing the sealing condition made by the sealing material receiving structure of FIG. 1.

Secondly, the tab terminals 3a are passed through the holes 10a of the enclosures 10 in a direction indicated by an arrow Z. The enclosures 10 prevent the portions of the packing 5 surrounding the holes 10a from being warped by the tab terminals 3a when the same are passed through the holes 10 a, respectively. The enclosures 10 are particularly effective for preventing the formation of gaps between the respective four corners of the holes 10a and the respective four edges of the tab terminals 3a. The formation of the gaps can be more effectively prevented when the respective four corners of the enclosures 10 and the respective four edges of the tab terminals 3a are rounded. Since the tab terminals 3a, the enclosures 10 and the holes 2c of the bottom cover 2 are formed so as to satisfy the foregoing inequality: $c - 2a < d$, the elastic enclosures 10 are compressed when the tab terminals are passed through the holes 10a, and hence the tab terminals 3a fit the holes 10a tight, respectively, while the enclosures 10 fit the holes 2 a respectively. A portion of each tab terminal 3a corresponding to the height of the enclosure 10 is in close contact with the packing 5 as illustrated in FIG. 5. Thus, the leakage of the sealing material filled in the junction block through the holes 10a of the packing 5 is prevented perfectly.

The enclosures 10 serve as positioning means in assembling the lower insulating plate 4, the packing 5 and the bottom cover 2.

As apparent from the foregoing description, in the sealing material receiving structure for a junction block according to the present invention, elastic walls are formed around the holes for receiving tab terminals of a sealing packing, and the respective dimensions of the elastic walls, the tab terminals and holes for receiving the elastic walls of a bottom cover are determined selectively so as to satisfy a fixed dimensional relation so that the tab terminals fit the holes of the sealing packing tight and the elastic walls fit the holes of the bottom cover tight, respectively. Thus, the leakage of the sealing material from the junction block can be prevented perfectly by simple means.

Furthermore, according to the present invention, a manual work for providing the junction block with means for preventing the leakage of the sealing material is unnecessary, and thereby time and labor for manufacturing the junction block and the manufacturing cost of the juction block are reduced.

Still further, the sealing material receiving structure of the present invention facilitates correctly disposing the tab terminals, prevents the faulty assembly of the insulating plates provided with the bus bars, the sealing packing and the bottom cover, facilitates positioning the components in assembling the junction block, and improves the quality of the junction block.

Although the invention has been described in its preferred form with a certain degree of particularity, it is to be understood that many changes and variations are possible in the invention without departing from the scope and spirit thereof.

What is claimed is:

1. A junction block structure to be filled with sealing material, comprising:
   a first cover provided with connector means for connecting to associated circuitry;
   a second cover provided with connector means for connecting to associated circuitry, said first and second covers each having an inner and outer surface;
   at least one insulating plate provided with bus bars having tab terminals, said at least one insulating plate being placed between said first and second covers;
   at least one plate-shaped packing formed of an elastic material having tab-receiving holes for receiving said tab terminals therethrough, said plate-shaped packing being placed between said at least one insulating plate and one of said first and second covers; and
   elastic enclosure means formed integrally with said plate-shaped packing and surrounding said tab-receiving holes for preventing said sealing material from leaking through gaps between said tab terminals and tab-receiving holes, said enclosure means having walls with end surfaces and having interior and exterior surfaces, said interior and exterior surfaces defining interior and exterior corners, said interior surfaces and interior corners defining first apertures aligned with said tab-receiving holes, said enclosure means projecting from said plate-shaped packing towards one of said first and second covers and being receivable by second apertures in at least one of said first and second covers, said second apertures each having inner surfaces, each said enclosure means satisfying the inequality $c-2a<d$ and $c>b$, where a is a thickness of said walls of said enclosure means, b is an outer major axial length of each said enclosure means, c is a major axial length of each said aperture in said at least one of said first and second covers, and d is a major axial width of each said tab terminal, said enclosure means being readily insertable into said second apertures in said at least one of said first and second covers, said outer surfaces of said enclosure means and said inner surfaces of said second apertures being initially spaced and contacting each other only when a said tab terminal is inserted into a tab-receiving hole and respective first aperture, said end surfaces of said walls being coplanar with said outer surface of said cover into which said enclosure means has been inserted, thereby preventing the formation of gaps between said tab terminal and said respective enclosure means.

2. A sealing material receiving structure according to claim 1, wherein said interior and exterior corners of each of said enclosure means, inner corners of each of said apertures formed in said at least one of said first and second covers, and edges of each of said tab terminals are rounded with substantially the same roundness.

* * * * *